(12) United States Patent
Hart et al.

(10) Patent No.: US 7,682,866 B2
(45) Date of Patent: Mar. 23, 2010

(54) NON-PLANARIZED, SELF-ALIGNED, NON-VOLATILE PHASE-CHANGE MEMORY ARRAY AND METHOD OF FORMATION

(75) Inventors: Mark W. Hart, San Jose, CA (US); Christie R. K. Marrian, San Jose, CA (US); Gary M. McClelland, Palo Alto, CA (US); Charles T. Rettner, San Jose, CA (US); Hemantha K. Wickramasinghe, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 68 days.

(21) Appl. No.: 11/335,329

(22) Filed: Jan. 19, 2006

(65) Prior Publication Data

US 2006/0145134 A1 Jul. 6, 2006

Related U.S. Application Data

(62) Division of application No. 10/835,814, filed on Apr. 30, 2004, now Pat. No. 7,038,231.

(51) Int. Cl.
*H01L 29/04* (2006.01)
*H01L 29/06* (2006.01)
*H01L 21/00* (2006.01)
*H01L 21/82* (2006.01)
*G11C 11/00* (2006.01)

(52) U.S. Cl. ............... 438/95; 438/128; 438/570; 257/2; 257/3; 257/4; 257/5; 257/529; 365/163; 365/175

(58) Field of Classification Search ............... 438/95, 438/100, 128, 258, 238, 386, 570; 257/2–5, 257/529, 530, 278, E27.004, E45.002
See application file for complete search history.

(56) References Cited

U.S. PATENT DOCUMENTS

| | | | |
|---|---|---|---|
| 3,699,543 | A | 10/1972 | Neale |
| 4,177,475 | A | 12/1979 | Holmberg |
| 4,597,162 | A | 7/1986 | Johnson et al. |
| 4,752,118 | A | 6/1988 | Johnson |
| 4,782,340 | A * | 11/1988 | Czubatyj et al. ............ 345/92 |
| 5,825,046 | A | 10/1998 | Czubatyj et al. |
| 6,087,674 | A | 7/2000 | Ovshinsky et al. |
| 6,111,264 | A | 8/2000 | Wolstenholme et al. |
| 6,252,274 | B1 | 6/2001 | Colabella |
| 6,399,446 | B1 | 6/2002 | Rangarajan et al. |
| 6,440,753 | B1 | 8/2002 | Ning et al. |
| 6,512,241 | B1 | 1/2003 | Lai |
| 6,567,293 | B1 | 5/2003 | Lowrey et al. |

(Continued)

*Primary Examiner*—David Vu
*Assistant Examiner*—Arman Khosraviani
(74) *Attorney, Agent, or Firm*—Gibb I.P. Law Firm, LLC (57) ABSTRACT

A method for fabrication and a structure of a self-aligned (crosspoint) memory device comprises lines (wires) in a first direction and in a second direction. The wires in the first direction are formed using a hard mask material that is resistant to the pre-selected etch processes used for creation of the lines in both the first and the second direction. Consequently, the hard mask material for the lines in the first direction form part of the memory stack.

20 Claims, 7 Drawing Sheets

U.S. PATENT DOCUMENTS

| | | |
|---|---|---|
| 6,569,705 B2 | 5/2003 | Chiang et al. |
| 6,570,784 B2 | 5/2003 | Lowrey |
| 6,579,742 B2 | 6/2003 | Chen |
| 6,579,760 B1 * | 6/2003 | Lung .......................... 438/257 |
| 8,579,760 | 6/2003 | Lung |
| 6,593,613 B1 | 7/2003 | Alsmeier et al. |
| 6,605,821 B1 | 8/2003 | Lee et al. |
| 6,607,974 B2 | 8/2003 | Harshfield |
| 6,633,497 B2 | 10/2003 | Nickel |
| 6,635,546 B1 | 10/2003 | Ning |
| 6,645,822 B2 | 11/2003 | Schlosser |
| 6,704,235 B2 * | 3/2004 | Knall et al. ............. 365/225.7 |
| 6,890,819 B2 * | 5/2005 | Wu et al. .................... 438/257 |
| 7,057,923 B2 * | 6/2006 | Furkay et al. ............... 365/163 |
| 2001/0034078 A1 | 10/2001 | Zahorik et al. |
| 2002/0031887 A1 * | 3/2002 | Harshfield .................. 438/257 |
| 2002/0081851 A1 * | 6/2002 | Vyvoda et al. ............. 438/690 |
| 2003/0062516 A1 | 4/2003 | Peterson |
| 2003/0067013 A1 * | 4/2003 | Ichihara et al. ............. 257/200 |
| 2003/0193063 A1 * | 10/2003 | Chiang et al. ............... 257/295 |
| 2004/0001374 A1 * | 1/2004 | Tanaka et al. ............... 365/200 |
| 2004/0114413 A1 * | 6/2004 | Parkinson et al. ........... 365/100 |
| 2004/0124407 A1 * | 7/2004 | Kozicki et al. ................. 257/9 |
| 2005/0062079 A1 * | 3/2005 | Wu et al. .................... 257/257 |
| 2005/0162881 A1 * | 7/2005 | Stasiak et al. ................ 365/63 |

* cited by examiner

NON-PLANARIZED, SELF-ALIGNED, NON-VOLATILE PHASE-CHANGE MEMORY ARRAY AND METHOD OF FORMATION

CROSS-REFERENCE TO RELATED APPLICATIONS

This application is a division of U.S. application Ser. No. 10/835,814 filed Apr. 30, 2004 now U.S. Pat. No. 7,038,231.

BACKGROUND OF THE INVENTION

1. Field of the Invention

The invention generally relates to high-density non-volatile memory circuits, and more particularly to memory devices based on phase-change materials.

2. Description of the Related Art

Memory devices based on phase change materials (PCM) are generally non-volatile, are capable of high read and write speeds, and are compatible with a relatively simple cell design. The phase change memory element is typically switched between a largely amorphous (high resistance) state and a largely crystalline (low resistance) state. Typical materials suitable for such electrically switchable phase-change memory elements are based on chalcogenides. These materials are typically switched by the application of heat generated by the passage of electrical current through the material. The cell state is determined by measurement of the cell resistance.

More specifically, heating the high resistance (amorphous) material to a set temperature, $T_c$, changes the phase of the low resistance (crystalline) state. As taught by U.S. Pat. Nos. 5,825,046 and 6,087,674, the complete disclosures of which are herein incorporated by reference, switching is accomplished by direct heating. Heating to a higher temperature, $T_m$, and quenching resets the PCM to its original phase. Thus, the set temperature, $T_c$, is associated with the change in phase from an amorphous state to a crystalline state. Heating to the reset temperature and quenching resets the chalcogenide to its amorphous phase.

Such phase-change memory is compatible with a cross-point architecture, as is taught in U.S. Pat. No. 6,579,760, the complete disclosure of which is herein incorporated by reference, where the cell size can approach the minimum cell size of approximately $4F^2$ (where "F" stands for "feature" as in minimum resolved feature), which is effectively the minimum cell size that can be uniquely and instantaneously addressed by electrical interconnects, for a two interconnect level design. In the context of a device size, $4F^2$ means that the area of the device is 4 times the minimum resolvable feature size squared. A lithography with a resolution of 100 nm could be used to create devices with an area of $4\times(10^{-7})^2 = 4\times10^{-14}$ cm$^2$. Combined with the demonstrated high-speed performance and its intrinsic non-volatile nature, phase change memories have the potential to compete with all existing memory devices.

In the U.S. Pat. No. 6,579,760 patent, a multilayer stack is first deposited containing a conduction layer for the lines of the first direction as well as the phase-change material and diode and heater layers. The whole stack is then patterned into lines. Then, oxide material is coated onto the lines and the structure is planarized. As these memory devices are pushed to higher densities, this planarization will become difficult and will require an unprecedented level of control. Indeed, the level of control required may not be achievable.

Accordingly, it is desirable to eliminate the planarization requirement. It is also desirable to minimize the number of processing steps, thereby increasing yield and reducing manufacturing costs.

SUMMARY OF THE INVENTION

The invention provides a memory array comprising a first material covered by a first hard mask layer forming a first set of lines; a second material over the first material; and a third material covered by a second hard mask layer, wherein the third material is over the second material and forms a second set of lines at an angle to the first set of lines; wherein the second material comprises memory storage material. The memory array further comprises an insulative substrate adjacent to the first material and a diode in electrical communication with the memory storage material, wherein the diode is adapted for preventing current from flowing through the memory storage material in more than one direction. Moreover, the memory array further comprises any of a heater layer and a diode layer over the memory storage material, wherein any of the heater layer and the diode layer over the memory storage material increases a resistance state between the first set of lines and the second set of lines.

According to an embodiment of the invention, each of the first material and the second material comprises conductive material, wherein a configuration (width) of each of the first hard mask layer and the second hard mask layer determines a width of each of the set of lines, and each of the first hard mask layer and the second hard mask layer comprises a patterned hard mask layer, wherein the conductive material comprises tantalum, and wherein the memory storage material comprises a chalcogenide. Furthermore, the first set of lines is approximately perpendicular (i.e., oriented at approximately 90 degrees) to the second set of lines. Moreover, the memory array further comprises an interface between the first set of lines and the memory storage material, wherein the interface creates a rectifying junction in the memory array.

Another aspect of the invention provides a method of forming a memory array, wherein the method comprises forming a bit line over a substrate, wherein the bit line comprises a first hard mask layer; depositing a multilayer stack over the bit line; and configuring a word line over the multilayer stack, wherein the word line comprises a second hard mask layer and is at an angle to the bit line, wherein the multilayer stack comprises a memory storage material, and wherein the bit line is oriented approximately perpendicular (i.e., approximately 90 degrees) to the word line.

The step of forming comprises depositing a first layer of conductive material on the substrate, and the step of configuring comprises depositing a second layer of conductive material on the multilayer stack, wherein each of the first hard mask layer and the second hard mask layer comprises conductive material and is etch resistant, and wherein the memory storage material comprises a phase-change material layer. Additionally, the step of forming comprises depositing a resist material on the first layer of conductive material; patterning the resist material, wherein portions of the resist material are removed to form gaps in the resist material; and depositing the first hard mask layer into the gaps.

Moreover, the method further comprises performing a first etching process to etch portions of the first layer of conductive material to form the bit line; performing a second etching process to etch portions of the second layer of conductive material and portions of the phase-change material layer, wherein the first hard mask layer protects the first layer of conductive material from the second etching process, and wherein the memory storage material contacts the bit line and the word line. Also, each of the first conductive layer and the second conductive layer comprises tantalum, and the memory storage material comprises a chalcogenide, and preferably, $Ge_2Sb_2Te_5$. The method further comprises forming a resistive material in contact with the phase-change material layer to facilitate heating of the phase-change material layer when current is passed between the bit line and the word line, wherein the resistive material comprises TaSiN.

Alternatively, the method further comprises forming a diode layer adjacent to the phase-change memory layer, wherein the diode layer is in electrical communication with the phase-change memory layer to prevent current from flowing through the phase-change memory layer in more than one direction. Additionally, each of the first hard mask layer and the second hard mask layer are formed of conductive materials. Also, the substrate is formed of insulative materials, and each of the first etching process and the second etching process comprises any of chemical etching and ion milling. The method also includes forming any of a heater layer and a diode layer over the phase-change material layer, wherein the formation of any of the heater layer and the diode layer over the phase-change material layer increases a resistance state between the bit line and the word line. Furthermore, the method comprises creating a rectifying junction at an interface between the bit line and the phase-change material layer.

The invention provides a simplified process for fabrication of self-aligned, nonvolatile memory structures such as those based on phase-change materials, and provides methods for manufacturing devices using the structure. This invention uses two masks that define lines in a first direction, (e.g. bit lines), and in a second direction, (e.g. word lines). The invention provides that planarization steps employed between the fabrication of the two sets of lines can be omitted for thin layers. The invention also provides that the hard mask used to form the lines may form part, or all, of the lines.

These and other aspects of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

The invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the invention. The examples used herein are intended merely to facilitate an understanding of ways in which the invention may be practiced and to further enable those of skill in the art to practice the invention. Accordingly, the examples should not be construed as limiting the scope of the invention.

As previously mentioned, it is desirable to eliminate the planarization requirement which the conventional techniques employ. Moreover, it is also desirable to minimize the number of process steps, thereby increasing yield and reducing costs. Accordingly, the invention provides a simplified process for the formation of a self-aligned (crosspoint) memory device that omits the planarization step and may incorporate hard mask material in the word and/or bit lines. Referring now to the drawings, and more particularly to FIGS. 1 through 13, there are shown preferred embodiments of the invention.

Figure 1:
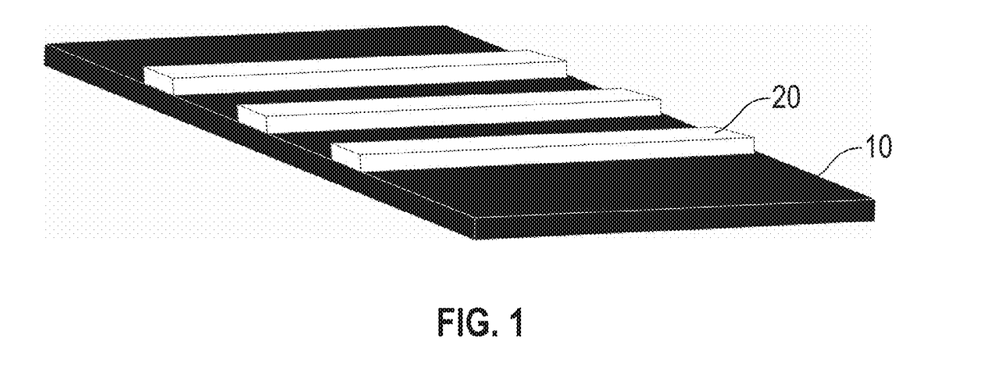
FIG. 1 is a schematic diagram of a partially completed memory array device according to an embodiment of the invention.

The invention removes the need for planarization by keeping the lines of the first direction relatively thin. In one embodiment, the first-direction lines comprise only of the metal needed for conduction of the lines. FIG. 1 shows a pattern of first-direction lines (e.g., bit lines) 20 on an insulating substrate 10. In one embodiment of the invention, shown in FIG. 11, the lines 20 comprise conductive material 22 such as tantalum 10 to 20 nm in thickness and 50 nm in width, formed by creating a chromium hard mask 24 over the tantalum layer 22 and etching the hard mask 24 using a fluorocarbon—based reactive ion etch. The chrome hard mask 24 can be made by "lift-off" methods, whereby a positive resist such as poly (methyl methacrylate) is exposed where the lines 20 are to be formed. The lines 20 are left with the chrome mask 24 as part of their structure. The lines 20 could also be made of pure chrome, thereby omitting the etch step all together.

Figure 2:
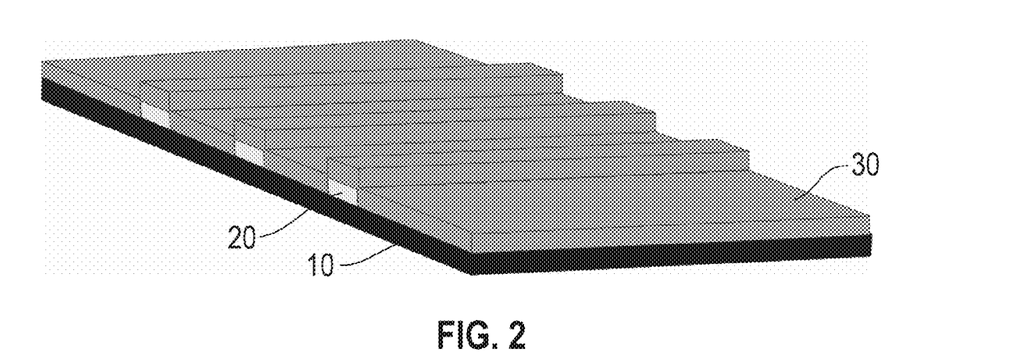
FIG. 2 is a schematic diagram of a partially completed memory array device according to an embodiment of the invention.

Alternatively, the hard mask 24 could be made by using a negative resist, such as hydrogen-silsesquioxane (HSQ), which would be patterned over a continuous film of the wire material. The resist acts as a hard mask in the formation of the wires, and then is removed. Preferably, the lines 20 should be resistant to the etching used to form the subsequent lines 40 in the second direction (shown in FIG. 3). After the formation of the lines 20, a multilayer stack 30 can then be deposited onto the lines 20, as illustrated in FIG. 2. In the event that the etching or handling process leaves the wires (lines 20) oxidized, it may be desirable to sputter clean the surface of the wires (lines 20) before depositing the stack 30. The stack 30 preferably includes layers of a phase-change material 33, as well as heater and/or diode material 32 (further illustrated in FIG. 10). In one embodiment illustrated in FIG. 12, a 20 nm thick chalcogenide is used as the phase-change material 33, with the composition $Ge_2Sb_2Te_5$. The stack 30 may also contain a heater layer 32, such as TaSiN, and a top layer 31.

Figure 3:
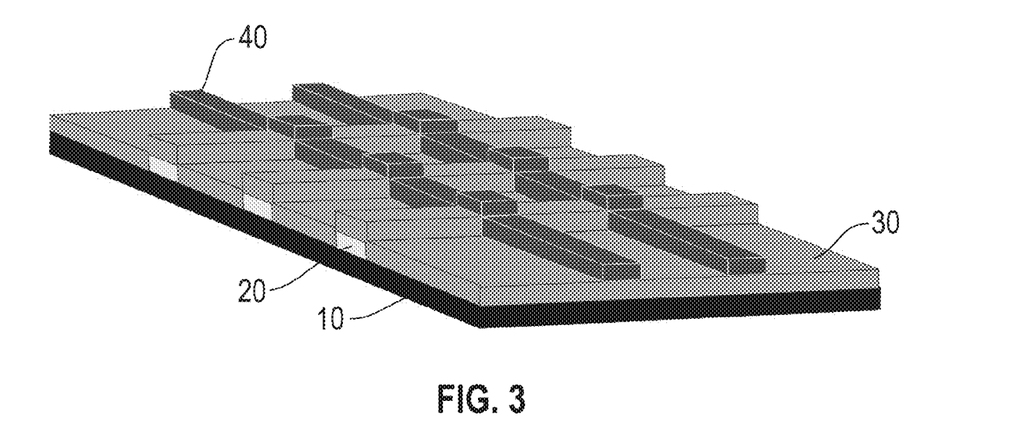
FIG. 3 is a schematic diagram of a partially completed memory array device according to an embodiment of the invention.

The next step in the process is to create a second wire line 40 in a second direction relative to the first direction of the first line 20. FIG. 3 shows the memory array device after the creation of the second wire line 40. In one embodiment of the invention, shown in FIG. 13, the line 40 (e.g., word lines) comprise conductive material 42 such as tantalum 10 to 20 nm in thickness and 50 nm in width, formed by creating an approximately 10 nm thick chromium hard mask 44 over the tantalum layer 42 and etching the hard mask 44 using a fluorocarbon-based reactive ion etch. The hard mask 44 can be made by "lift-off" methods, whereby a positive resist such as poly (methyl methacrylate) is exposed where the lines 40 are to be formed. The chrome metal 44 can then be deposited onto the sample, forming wires (lines 40) only where the resist has been removed. Alternatively, the mask 44 could be made by using a negative resist, such as hydrogen-silsesquioxane (HSQ), which would be patterned over a continuous film of the wire material. The resist would act as a hard mask 44 in the formation of the wires, and then would be subsequently removed. In one embodiment, the top layer 31 of the stack 30 can optionally be a conductor that will form the lines 40 in the second direction.

Figure 4:
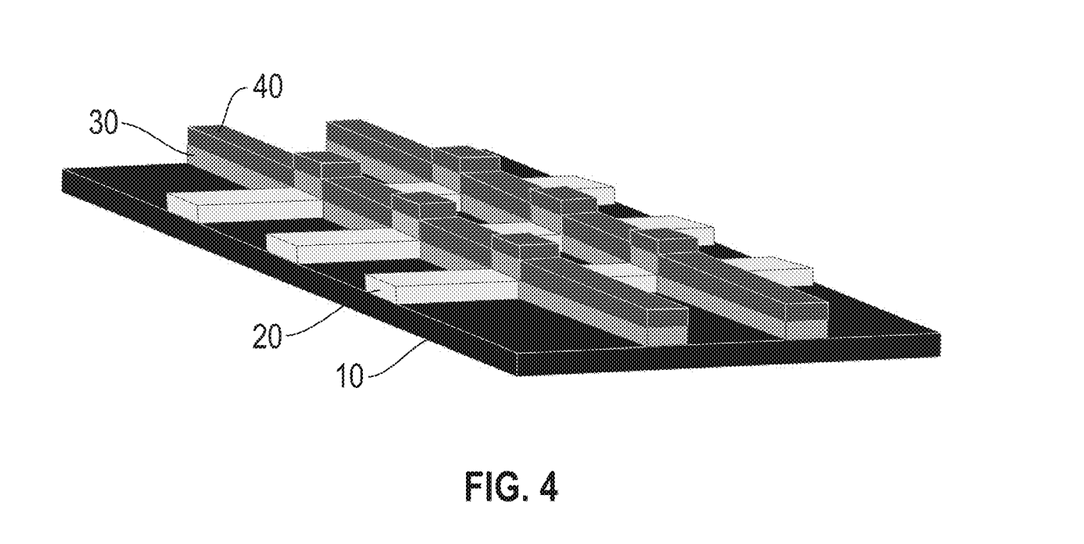
FIG. 4 is a schematic diagram of a completed memory array device according to an embodiment of the invention.
Figure 5:
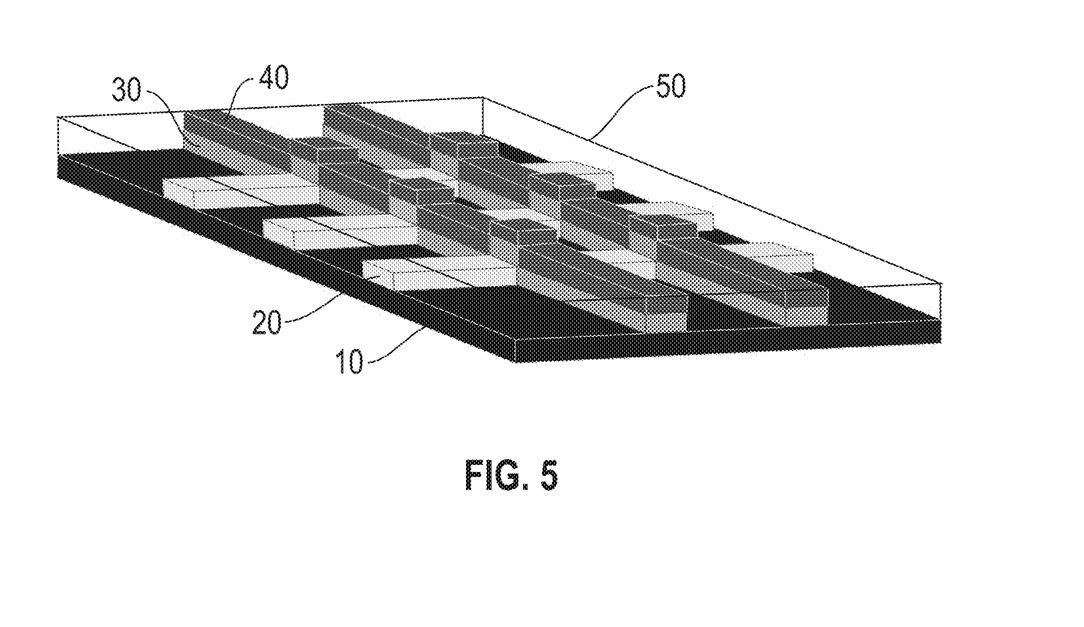
FIG. 5 is an alternate schematic diagram of a completed memory array device according to an embodiment of the invention.

FIG. 4 shows the structure after an etching process is performed that forms the hard mask lines 40 in the second direction. Again, the hard mask 44 can optionally be part of the conduction path of these lines 40, as well as any conductor added to the stack. In one embodiment, the lines 40 comprise a 10 nm (thickness) tantalum and 10 nm (thickness) chromium hard mask, which contribute approximately equally to the conductivity of the lines. After defining the structure of FIG. 4, the device may be encapsulated by a capping layer 50 (e.g., by deposition of alumina or silicon dioxide), as illustrated in FIG. 5, to prevent degradation (e.g. volatization) of the phase-change material 33 (shown in FIG. 10).

Figure 6:
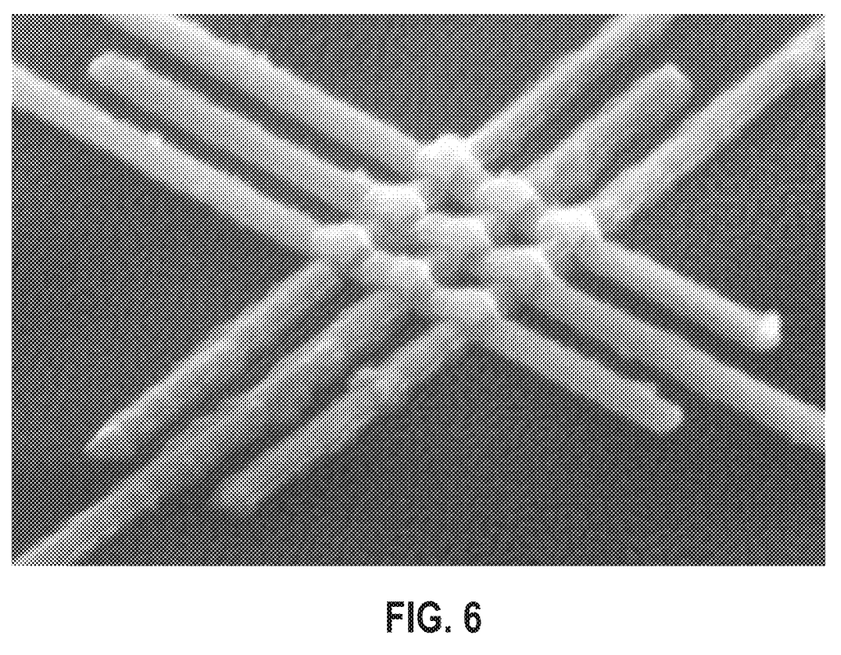
FIGS. 6 and 7 are scanning electron microscopy (SEM) images of a completed memory array device according to an embodiment of the invention.
Figure 7:
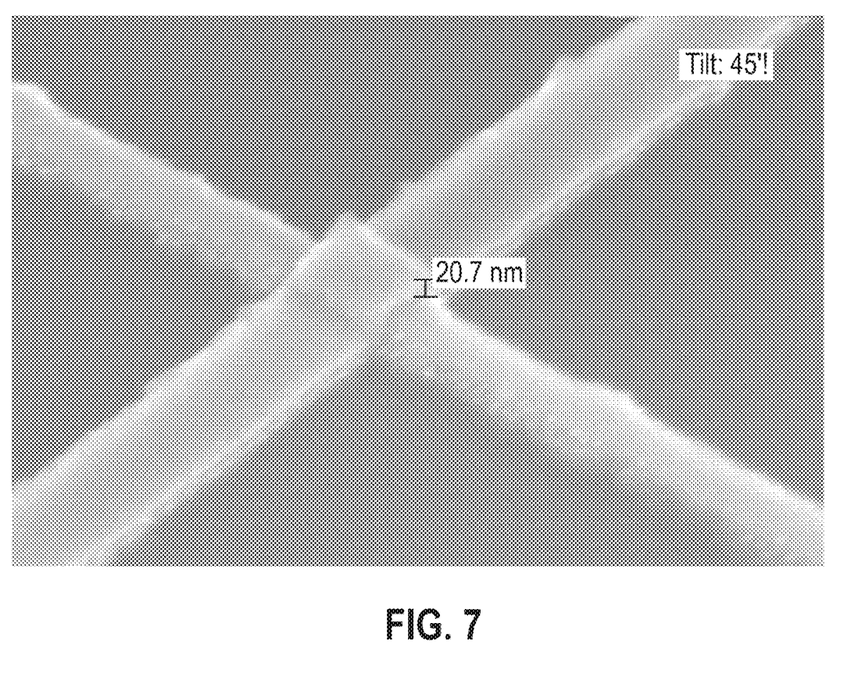

FIGS. 6 and 7 show scanning electron microscopy (SEM) images of a final structure made with the above-described approach. Here, the chrome hard mask 40 constitutes part of both sets of lines 20, 40. As illustrated in FIGS. 6 and 7, the lower lines (lines in the first direction) 20 comprise chromium deposited over tantalum. In one embodiment, the upper lines (lines in the second direction) 40 include an approximately 20 nm layer of phase-change material with tantalum on top, as well as a chromium layer that is used as the hard mask for the second etch process. Again, this second etch process stops at the chromium layer on top of the lower lines 20 (best seen in FIG. 4). As depicted in FIG. 7, again, the lower lines (lines in the first direction) 20 comprise chromium deposited over tantalum.

Figure 8A:
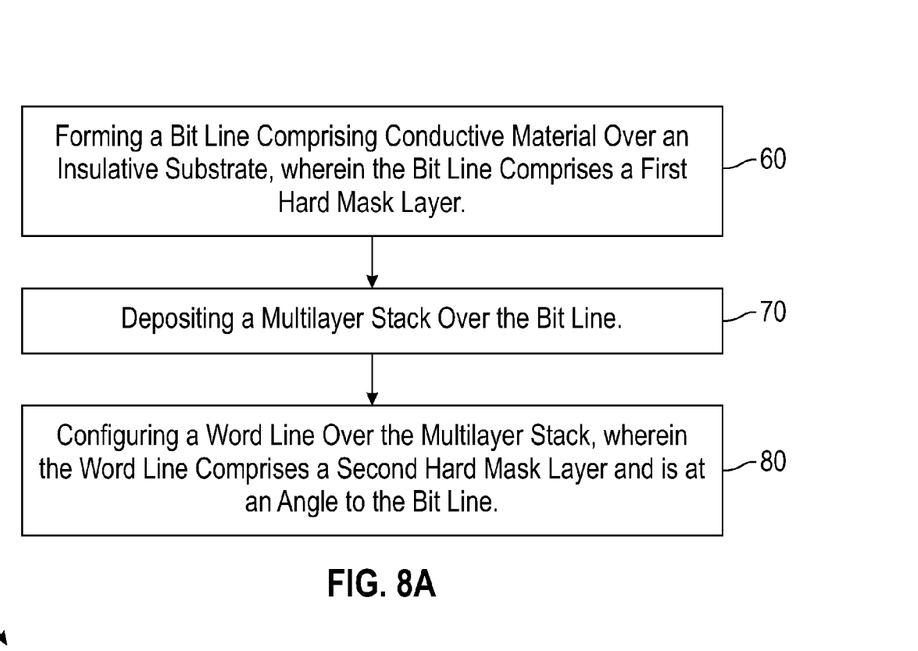
FIGS. 8(a) through 8(c) are flow diagrams illustrating preferred methods of the invention.

The flow diagram of FIG. 8(a) illustrates a method of forming a crosspoint memory array, wherein the method comprises forming (60) a bit line 20 comprising conductive material over an insulative substrate 10, wherein the bit line 20 comprises a first hard mask layer 24; depositing (70) a multilayer stack 30 over the bit line 20; and configuring (80) a word line 40 over the multilayer stack 30, wherein the word line 40 comprises a second hard mask layer 44 and is at an angle to the bit line 20, wherein the multilayer stack 30 comprises a memory storage material 30, and wherein the bit line 20 is oriented at approximately 90 degrees (perpendicular) with respect to the word line 40.

Figure 8B:
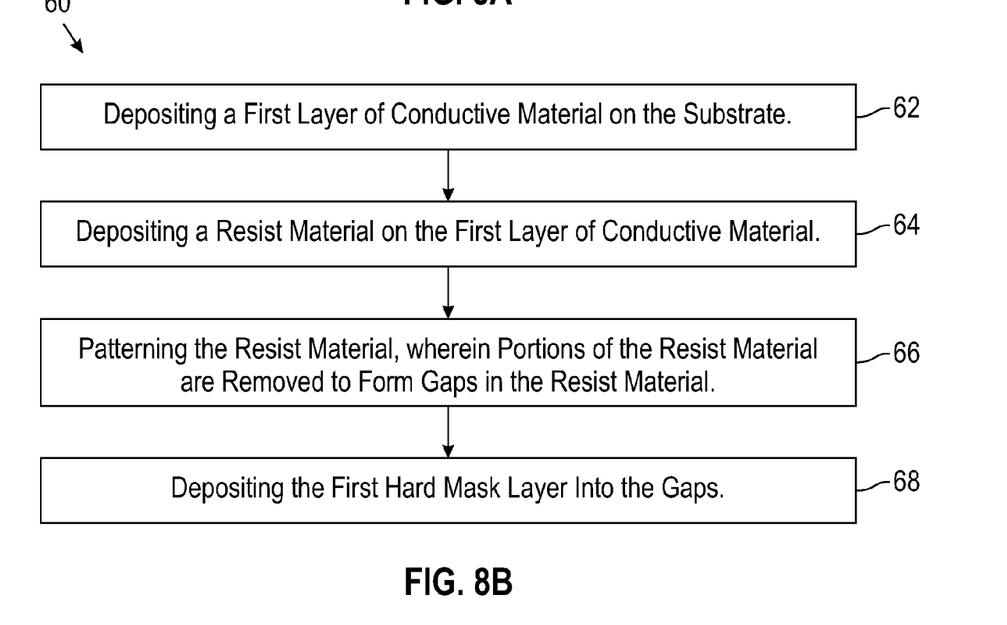

As shown in FIG. 8(b), the step of forming (60) further comprises depositing (62) a first layer 22 of conductive material on the substrate 10, depositing (64) a resist material (not shown) on the first layer 22 of conductive material, patterning (66) the resist material, wherein portions of the resist material are removed to form gaps (not shown) in the resist material, and depositing (68) the first hard mask layer 24 into the gaps.

Additionally, the step of configuring (80) comprises depositing a second layer 42 of conductive material on the multilayer stack 30, wherein each of the first hard mask layer 24 and the second hard mask layer 44 comprises conductive material and is etch resistant, and wherein the memory storage material 30 comprises a phase-change material layer 33. Furthermore, the method comprises creating a rectifying junction at an interface between the bit line 20 and the phase-change material layer 33.

Figure 8C:
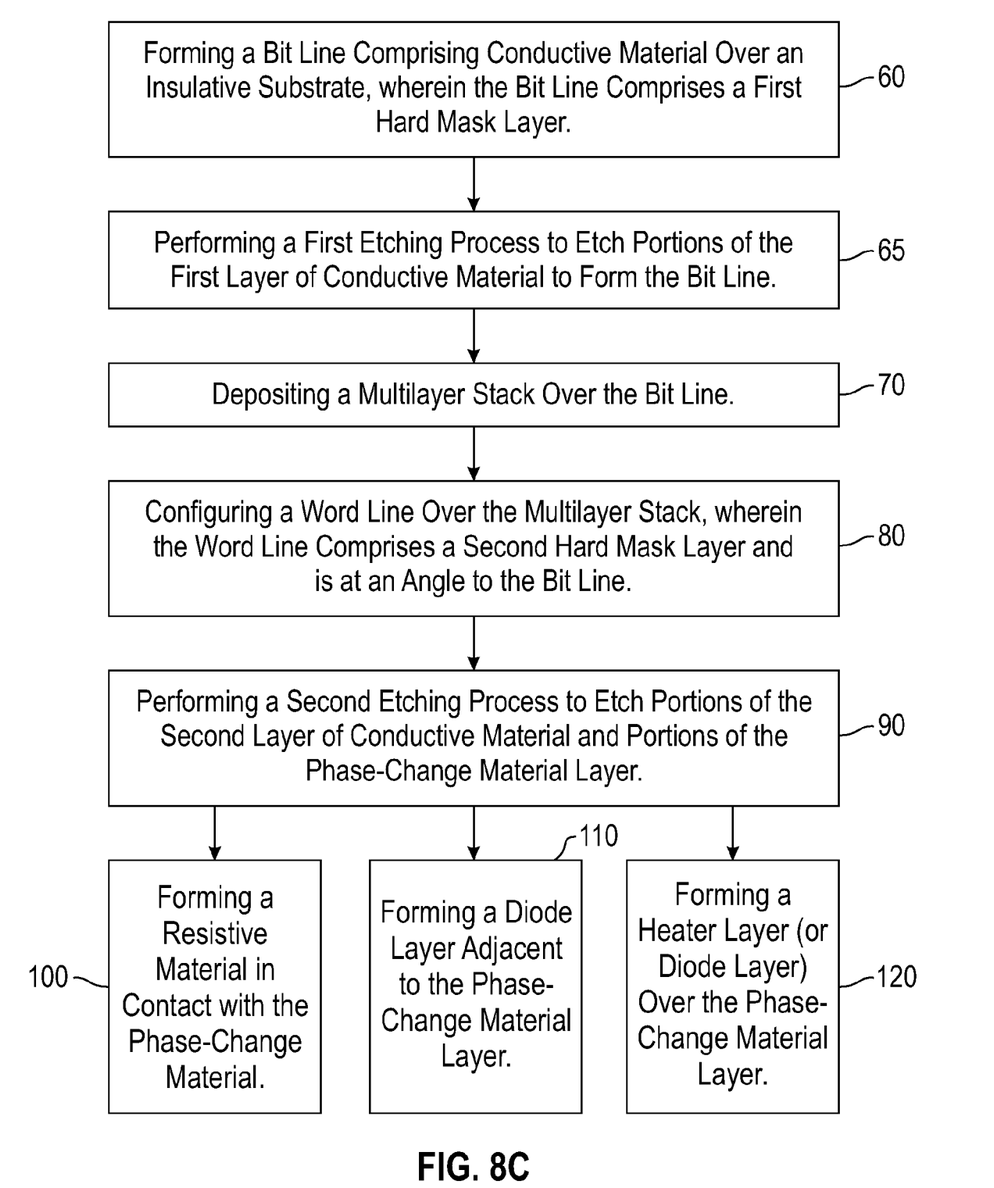

Moreover, as illustrated in FIG. 8(c), the method comprises performing (65) a first etching process to etch portions of the first layer 22 of conductive material to form the bit line 20 after the step of forming (60). Additionally, the method further comprises performing (90) a second etching process to etch portions of the second layer 42 of conductive material and portions of the phase-change material layer 33 after the step of configuring (80), wherein the first hard mask layer 24 protects the first layer 22 of conductive material from the second etching process 90, and wherein the memory storage material 30 contacts the bit line 20 as well as the word line 40. Also, each of the first conductive layer 22 and the second conductive layer 42 comprises tantalum, and the memory storage material 30 comprises a chalcogenide. The method further comprises forming (100) a resistive material 32 in contact with the phase-change material 33 to facilitate heating of the phase-change material 33 when current is passed between the bit line 20 and the word line 40, wherein the resistive material 32 comprises TaSiN.

Alternatively, the method comprises forming (110) a diode layer 32 adjacent to the phase-change material layer 33, wherein the diode layer 32 is in electrical communication with the phase-change memory layer 33 to prevent current from flowing through the phase-change memory layer 33 in more than one direction. Additionally, each of the first hard mask layer 24 and the second hard mask layer 44 are formed of conductive materials, and each of the first etching process (65) and the second etching process (90) comprises any of chemical etching and ion milling. The method also includes forming (120) a heater layer (or diode layer) 32 over the phase-change material layer 33, wherein the formation of the heater layer (or diode layer) 32 over the phase-change material layer 33 increases a resistance state between the bit line 20 and the word line 40.

Figure 9:
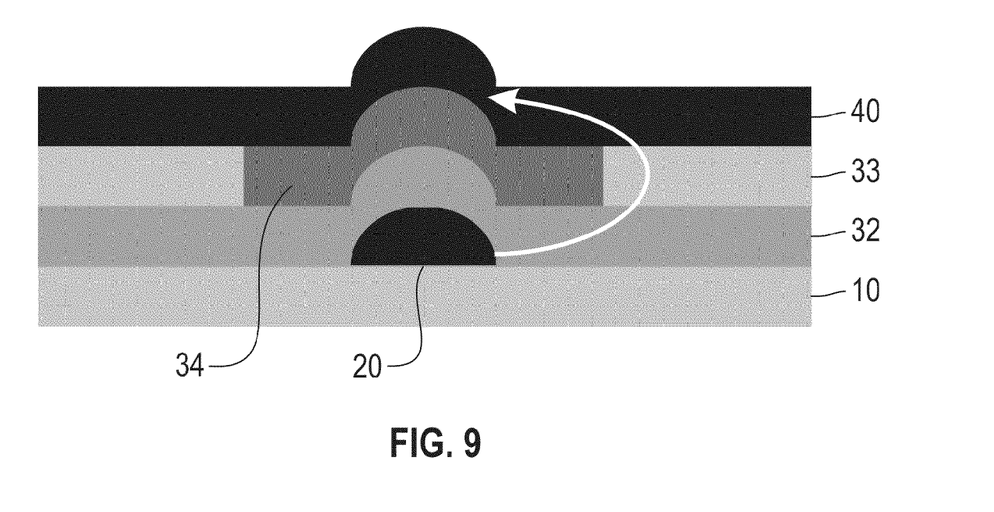
FIG. 9 is a cross-sectional diagram of a memory array device.
Figure 10:
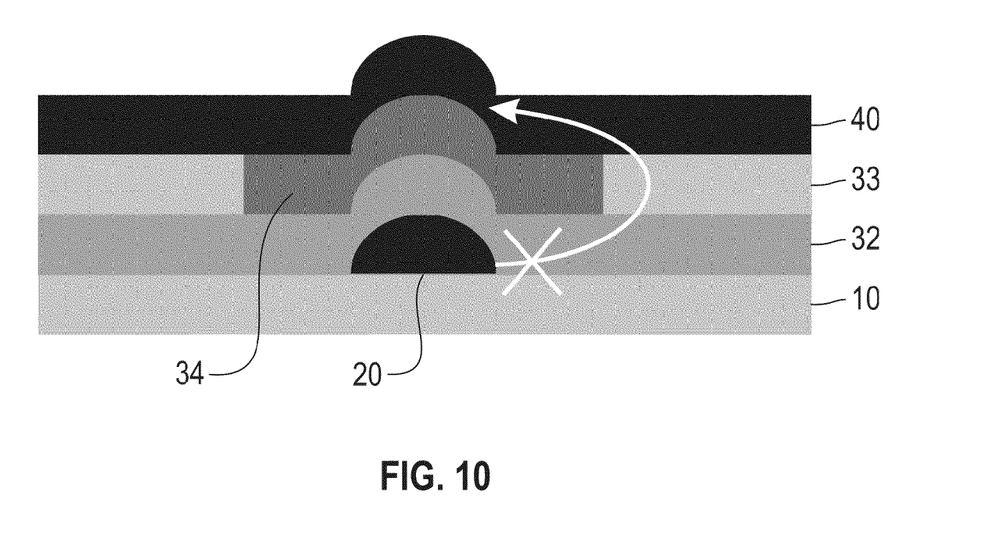
FIG. 10 is a cross-sectional diagram of a memory array device according to an embodiment of the invention.
Figure 11:
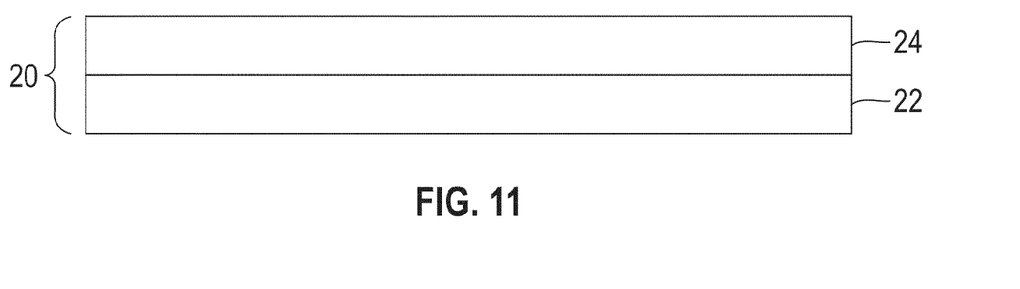
FIG. 11 is a cross-sectional diagram of the bottom wire/line of the memory array device of FIGS. 1 through 7.
Figure 12:
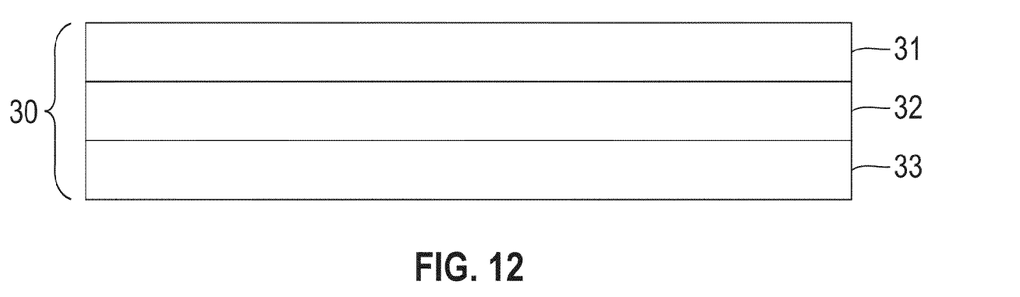
FIG. 12 is a cross-sectional diagram of the multilayer stack of the memory array device of FIGS. 2 through 7.
Figure 13:
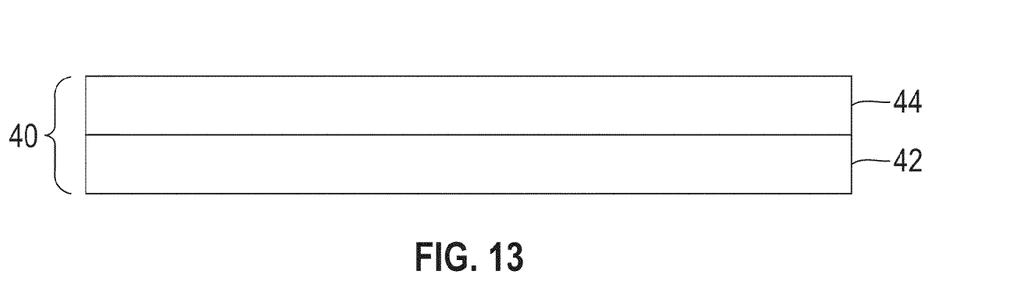
FIG. 13 is a cross-sectional diagram of the upper wire/line of the memory array device of FIGS. 3 through 7.

Because there is an asymmetry between the two sets of wires 20, 40, as the stack material 30 extends along the length of the top wires 40, but not the bottom wires 20, the order of the layers in the stack as provided by the invention is advantageous in the approach described herein. For example, in the case of the switching of a phase-change material to a high resistance state, the resistance between the two wires 20, 40 could depend on the order of the materials in the stack. This is further illustrated in FIGS. 9 and 10, wherein the stack material 30 is shown as a separate heater material layer 32 and PCM layer 33. Here, the bottom wire 20 is shown in cross-section with the PCM 33 and heater material 32 under a top wire 40 that runs asymmetric to the bottom wire 20. In FIGS. 9 and 10, the top wire 40 is drawn to run parallel (along the plane of the drawing), and the bottom wire 20 is draw to run perpendicular (within the plane of the drawing). Additionally, in FIGS. 9 and 10, the PCM 33 may be switched to a high resistance state in the region 34 shown, which remains a part of the overall PCM 33.

In FIG. 9, the heater layer 32 is in contact with the lower wire 20. Conversely, in FIG. 10 the PCM 33 is in contact with the lower wire 20. In the case of FIG. 10 where the PCM 33 is in contact with the bottom wire 20, the high-resistance state of the cell (i.e., the memory array) will be higher than if a more conducting material in the stack, such as the heater layer (or diode layer 32), is placed in contact with the lower wire 20 (FIG. 9). In the configuration shown in FIG. 9, the resistance of the device may be lowered due to the alternative, undesired, lower resistance path illustrated by the arrow. Placing the PCM 33 in contact with the lower wire 20 removes this alternative path as indicated by the "X" through the arrow in FIG. 10. FIGS. 9 and 10 show only one pair of wires 20, 40. As such, a preferred embodiment of the invention is illustrated in the configuration shown in FIG. 10.

Strong rectification may be required in each cell to provide a means of selecting individual cells by applying a voltage to one top line 40 and one bottom line 20. In general, rectification is associated with the interface of two materials, or of two differently doped regions of a material. The only interface which is confined to a single cell, and not extended along a line so as to create lower resistance paths, is the interface between the first line 20 and the next layer (i.e. layer 32 in FIG. 9 or layer 33 in FIG. 10) of the multilayer stack 30. Preferably, the materials of the first line 20 and the bottom layer 33 of the multilayer stack 30 may be chosen to form a rectifying junction 34. In other words, the phase change material 33 itself may be chosen to form a rectifying junction 34 with the bottom line 20.

Generally, the invention provides a crosspoint memory array comprising an insulative substrate 10; a bit line 20 comprising a first hard mask layer 24; a multilayer stack 30 over the bit line 20; and a word line 40 comprising a second hard mask layer 44, wherein the word line 40 is formed over the multilayer stack 30 and at an angle to the bit line 20, and wherein the multilayer stack 30 comprises a phase-change material layer 33 and a heater layer 32. According to an embodiment of the invention, the bit line 20 and word line 40 each comprise conductive material 22, 42, respectively, wherein the conductive material 22, 42 comprises tantalum. Moreover, the first hard mask layer 24 and the second hard mask layer 44 each determine a width of the respective bit line 20 and word line 40. Additionally, each of the first hard mask layer 44 and the second hard mask layer 42 comprises a patterned hard mask layer. Furthermore, the phase-change material layer 33 comprises a chalcogenide, and the heater layer (or diode layer) 32 is in electrical communication with the phase-change material layer 33, wherein the heater layer (or diode layer) 32 is adapted for preventing current from flowing through the phase-change material layer 33 in more than one direction. The memory array further comprises a heater layer (or diode layer) 32 over the phase-change material layer 33, wherein the configuration of the heater layer (or diode layer) 32 over the phase-change material layer 33 increases a resistance state between the bit line 20 and the word line 40. Also, the bit line 20 is oriented at approximately 90 degrees (perpendicular) with respect to the word line 40. Additionally, the memory array further comprises an interface between the bit line 20 and the phase-change material layer 33, wherein the interface creates a rectifying junction 34 in the memory array.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the invention can be practiced with modification within the spirit and scope of the appended claims.

What is claimed is:

1. A method of forming a memory array, said method comprising:
    forming a bit line over a substrate, wherein said bit line comprises a first hard mask layer;
    depositing a multilayer stack over said bit line;
    configuring a word line over said multilayer stack, wherein said word line comprises a second hard mask layer and is at an angle to said bit line, wherein said multilayer stack comprises a memory storage material, wherein said memory storage material is formed of a phase change material layer, and
    wherein said memory storage material directly contacts said bit line and said substrate; and
    creating a rectifying junction at an interface between said bit line and said phase-change material layer.

2. The method according to claim 1, wherein said forming of said bit line comprises depositing a first layer of conductive material on said substrate, wherein said configuring of said word line comprises depositing a second layer of conductive material on said multilayer stack, and wherein each of said first hard mask layer and said second hard mask layer comprises conductive material and is etch resistant.

3. The method according to claim 2, further comprising:
    performing a first etching process to etch portions of said first layer of conductive material to form said bit line;
    performing a second etching process to etch portions of said second layer of conductive material and portions of said phase-change material layer,
    wherein said first hard mask layer protects said first layer of conductive material from said second etching process.

4. The method according to claim 2, wherein said forming comprises:
    depositing a resist material on said first layer of conductive material;
    patterning said resist material, wherein portions of said resist material are removed to form gaps in said resist material; and
    depositing said first hard mask layer into said gaps.

5. The method according to claim 2, wherein each of said first conductive layer and said second conductive layer comprises tantalum.

6. The method according to claim 1, wherein said memory storage material comprises a chalcogenide.

7. The method according to claim 4, further comprising forming a resistive material in contact with said phase-change material layer to facilitate heating of said phase-change material layer when current is passed between said bit line and said word line.

8. The method according to claim 4, wherein said resistive material comprises TaSiN.

9. The method according to claim 2, further comprising forming a diode layer adjacent to said phase-change memory layer, wherein said diode layer is in electrical communication with said phase-change memory layer to prevent current from flowing through said phase-change material layer in more than one direction.

10. The method according to claim 2, further comprising forming any of a heater layer and a diode layer over said phase-change material layer, wherein the formation of any of said heater layer and said diode layer over said phase-change material layer increases a resistance state between said bit line and said word line.

11. The method according to claim 1, wherein said bit line is oriented approximately perpendicular to said word line.

12. The method according to claim 1, wherein each of said first hard mask layer and said second hard mask layer are formed of conductive materials, and said substrate is formed of insulative materials.

13. The method according to claim 3, wherein each of said first etching process and said second etching process comprises any of chemical etching and ion milling.

14. The method according to claim 2, further comprising creating a rectifying junction at an interface between said bit line and said phase-change material layer.

15. A method of forming a memory array, said method comprising:
  forming a substrate;
  forming a bit line over said substrate, wherein said bit line comprises a first chromium mask layer adapted to be resistant to both a first and second etching process;
  forming a multilayer stack over said bit line, wherein said multilayer stack comprises a phase-change material layer and a heater layer;
  forming a word line over said multilayer stack, wherein said word line comprises a second chromium mask layer adapted to be resistant to said second etching process, wherein said word line is positioned at an angle to said bit line, and wherein said phase-change material layer is in direct contact with each of said bit line and said substrate; and
  creating a rectifying junction at an interface between said bit line and said phase-change material layer.

16. A method of forming a memory array, said method comprising:
  forming a bit line over a substrate, wherein said bit line comprises a first chromium hard mask layer;
  depositing a multilayer stack over said bit line;
  configuring a word line over said multilayer stack, wherein said word line comprises a second chromium hard mask layer and is at an angle to said bit line, wherein said multilayer stack comprises a memory storage material, wherein said memory storage material is formed of a phase-change material layer, and wherein said memory storage material directly contacts said bit line and said substrate; and
  creating a rectifying junction at an interface between said bit line and said phase-change material layer.

17. The method according to claim 16, wherein said forming of said bit line comprises depositing a first layer of conductive material on said substrate, wherein said configuring of said word line comprises depositing a second layer of conductive material on said multilayer stack, and wherein each of said first hard mask layer and said second hard mask layer comprises conductive material and is etch resistant.

18. The method according to claim 17, further comprising:
  performing a first etching process to etch portions of said first layer of conductive material to form said bit line;
  performing a second etching process to etch portions of said second layer of conductive material and portions of said phase-change material layer,
  wherein said first hard mask layer protects said first layer of conductive material from said second etching process.

19. The method according to claim 17, wherein said forming comprises:
  depositing a resist material on said first layer of conductive material;
  patterning said resist material, wherein portions of said resist material are removed to form gaps in said resist material; and
  depositing said first hard mask layer into said gaps.

20. The method according to claim 17, wherein each of said first conductive layer and said second conductive layer comprises tantalum.

* * * * *